(12) United States Patent
Streppel

(10) Patent No.: US 9,285,102 B2
(45) Date of Patent: Mar. 15, 2016

(54) RADIATION-EMITTING COMPONENT

(75) Inventor: Ulrich Streppel, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 444 days.

(21) Appl. No.: 13/700,415

(22) PCT Filed: Jul. 8, 2011

(86) PCT No.: PCT/EP2011/061664
§ 371 (c)(1),
(2), (4) Date: Feb. 25, 2013

(87) PCT Pub. No.: WO2012/007392
PCT Pub. Date: Jan. 19, 2012

(65) Prior Publication Data
US 2013/0148348 A1 Jun. 13, 2013

(30) Foreign Application Priority Data
Jul. 15, 2010 (DE) .......................... 10 2010 027 212

(51) Int. Cl.
| | |
|---|---|
| *F21V 1/00* | (2006.01) |
| *F21V 11/00* | (2015.01) |
| *F21V 13/04* | (2006.01) |
| *H01L 33/58* | (2010.01) |
| *H01L 33/60* | (2010.01) |
| *F21V 13/12* | (2006.01) |
| *H01L 25/075* | (2006.01) |
| *H01L 33/56* | (2010.01) |

(52) U.S. Cl.
CPC ................. *F21V 13/04* (2013.01); *F21V 13/12* (2013.01); *H01L 33/58* (2013.01); *H01L 33/60* (2013.01); *H01L 25/0753* (2013.01); *H01L 33/56* (2013.01); *H01L 2224/48091* (2013.01); *H01L 2224/48465* (2013.01)

(58) Field of Classification Search
CPC ......... F21V 19/02; F21V 13/04; F21V 13/12; H01L 2224/48091; H01L 2924/00; H01L 2224/48465
USPC ............... 362/235, 311.02, 296, 308, 311.09; 257/98
See application file for complete search history.

(56) References Cited

U.S. PATENT DOCUMENTS

| | | | |
|---|---|---|---|
| 4,009,394 | A | 2/1977 | Mierzwinski |
| 5,893,633 | A | 4/1999 | Uchio et al. |
| 7,238,967 | B2 | 7/2007 | Kuwabara et al. |
| 2004/0136202 | A1 | 7/2004 | Ishida et al. |

(Continued)

FOREIGN PATENT DOCUMENTS

| | | |
|---|---|---|
| DE | 10 2006 050 880 A1 | 4/2008 |
| EP | 1 235 281 A1 | 8/2002 |

(Continued)

*Primary Examiner* — Anh Mai
*Assistant Examiner* — Jessica M Apenteng
(74) *Attorney, Agent, or Firm* — Slater & Matsil, L.L.P.

(57) ABSTRACT

A radiation-emitting component with a semiconductor body is intended for emitting electromagnetic radiation from its front side. The component also includes a reflective optical element. This optical element is intended to direct some of the radiation emitted by the semiconductor body, which impinges directly on the reflective optical element, into an outer region of a target zone. A refractive optical element is intended to focus the reflected fraction of the radiation into the outer region of the target zone and to focus the remaining fraction of the radiation into an inner region of the target zone.

13 Claims, 12 Drawing Sheets

(56) References Cited

U.S. PATENT DOCUMENTS

| | | |
|---|---|---|
| 2006/0119250 A1 | 6/2006 | Suehiro et al. |
| 2007/0262328 A1 | 11/2007 | Bando |
| 2008/0062682 A1 | 3/2008 | Hoelen et al. |
| 2008/0185605 A1* | 8/2008 | Wada et al. .................. 257/98 |
| 2009/0135605 A1 | 5/2009 | Xu et al. |
| 2009/0275266 A1 | 11/2009 | Winberg et al. |
| 2009/0284951 A1 | 11/2009 | Muschaweck |
| 2011/0193118 A1* | 8/2011 | Oshima et al. ................ 257/98 |

FOREIGN PATENT DOCUMENTS

| | | |
|---|---|---|
| JP | 05-037028 A | 2/1993 |
| JP | 2001-036150 A | 2/2001 |
| JP | 2004-327955 A | 11/2004 |
| JP | 2005-109172 A | 4/2005 |
| JP | 2007-019096 A | 1/2007 |
| JP | 2007-227480 A | 9/2007 |
| WO | WO 2009/041767 A2 | 4/2009 |

* cited by examiner

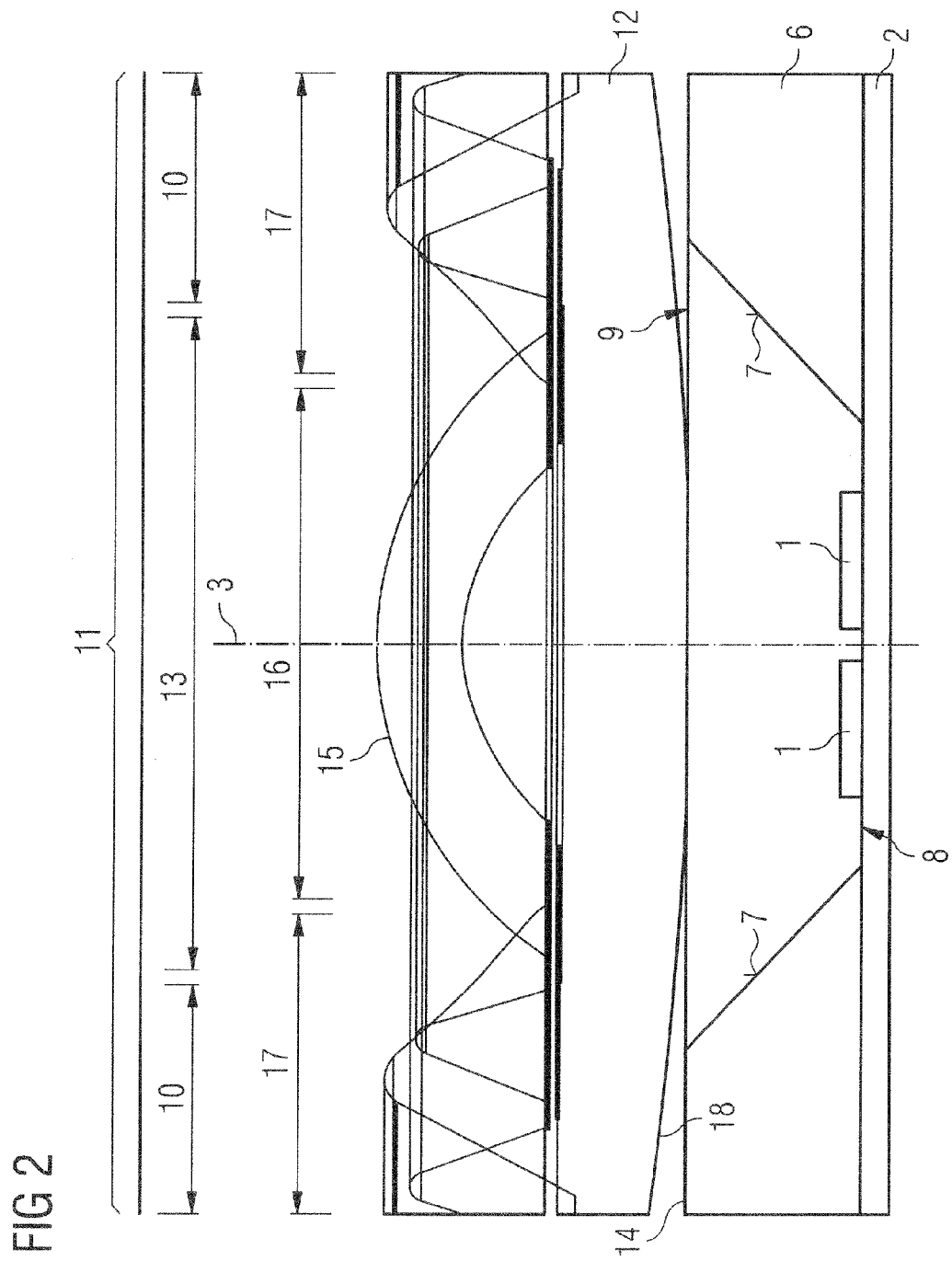

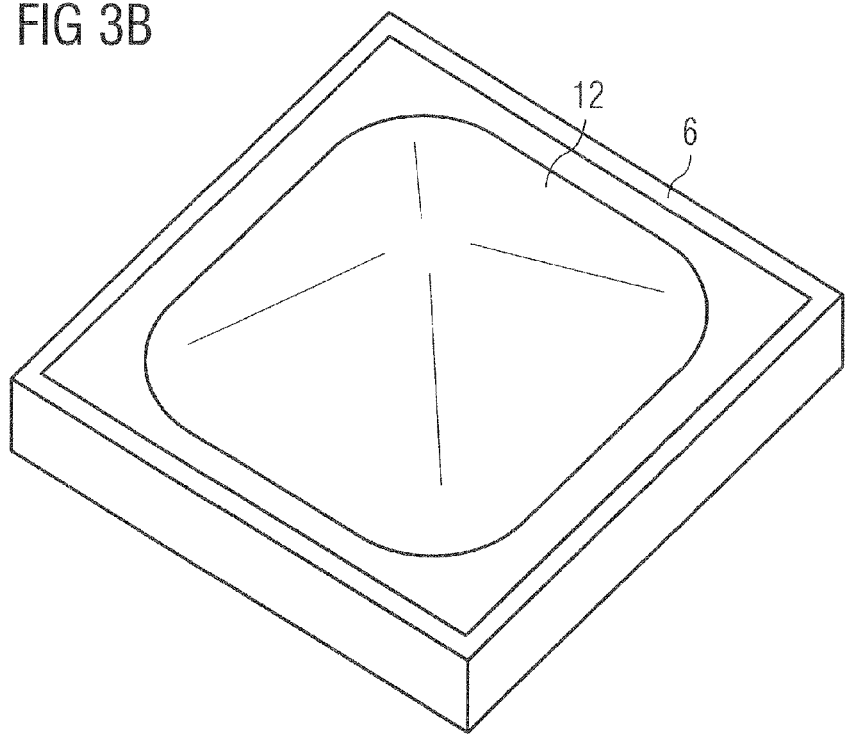
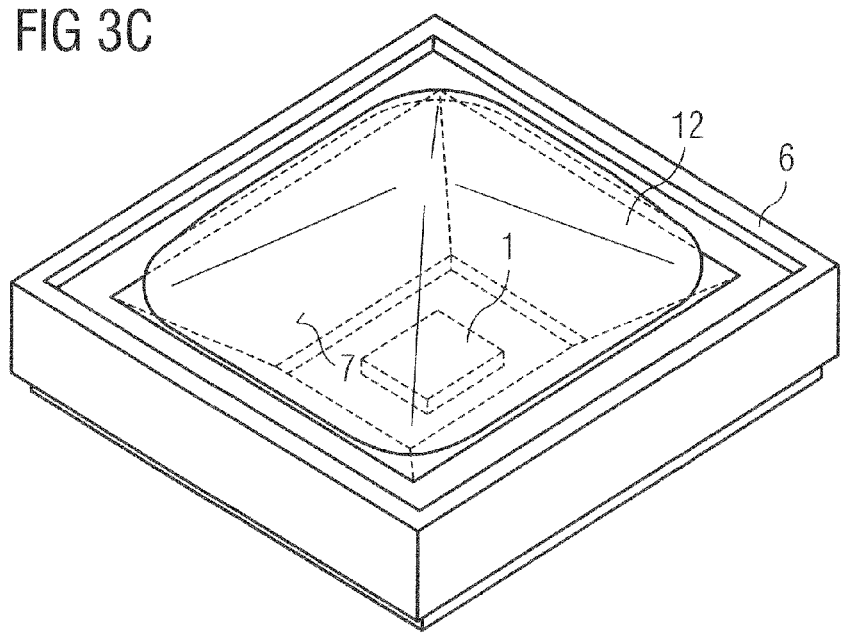

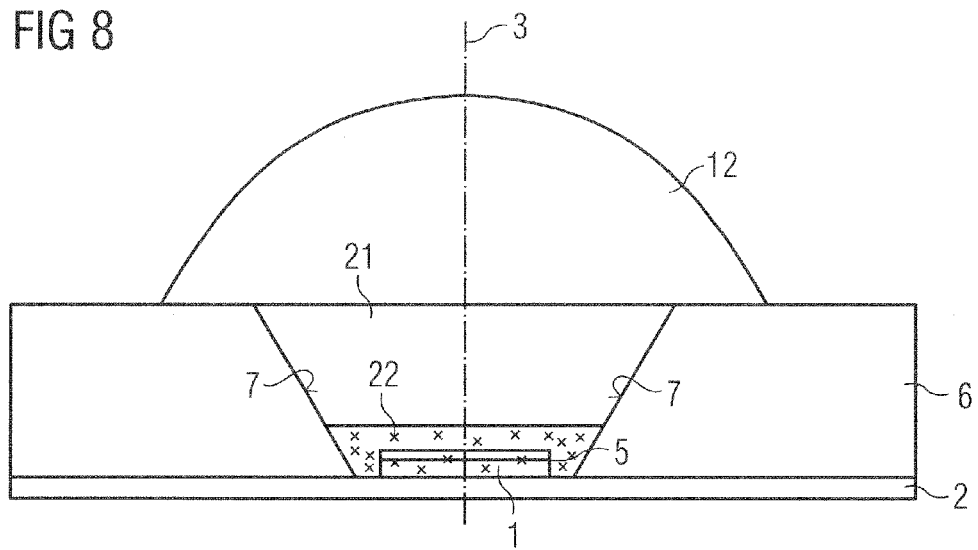
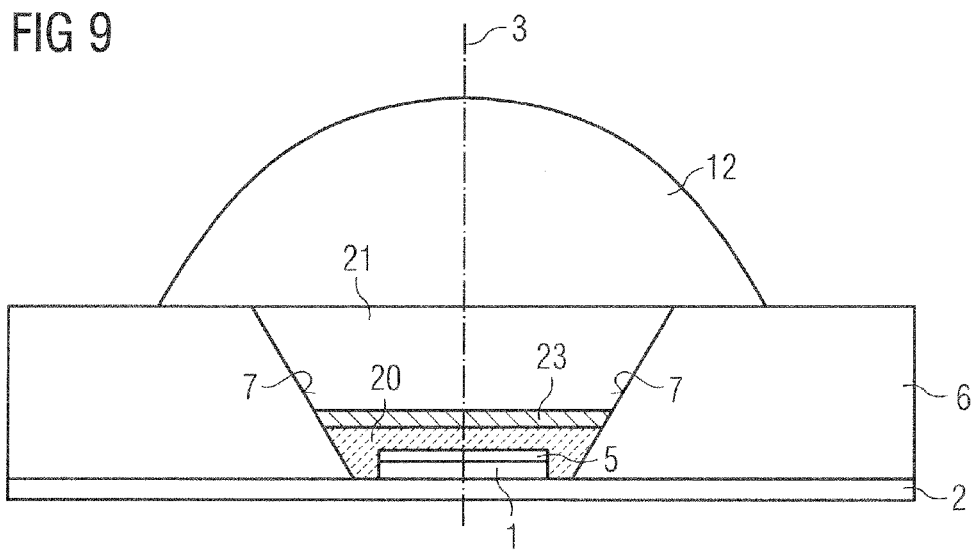

RADIATION-EMITTING COMPONENT

This patent application is a national phase filing under section 371 of PCT/EP2011/061664, filed Jul. 8, 2011, which claims the priority of German patent application 10 2010 027 212.4, filed Jul. 15, 2010, each of which is incorporated herein by reference in its entirety.

TECHNICAL FIELD

The invention relates to a radiation-emitting component.

SUMMARY OF THE INVENTION

In one aspect, the present invention provides a radiation-emitting component which is suitable for illuminating a target zone of a predetermined shape in accordance with a predetermined homogeneity.

Such a radiation-emitting component comprises a semiconductor body, which is intended for emitting electromagnetic radiation from its front side. A reflective optical element has a plurality of oblique, reflective side faces, arranged so as to surround the semiconductor body. A refractive optical element, is arranged downstream of the reflective optical element in the direction of emission of the semiconductor body.

According to one embodiment, the semiconductor body is intended for emitting electromagnetic radiation from its front side, such that a first part of the radiation impinges directly on the optical reflective element and a second part of the radiation impinges directly on the refractive optical element, the reflective optical element being intended to direct the first part of the radiation towards an outer region of a target zone to be illuminated and the refractive optical element being intended to focus the first part of the radiation into the outer region of the target zone and to focus the second part of the radiation into an inner region of the target zone.

The refractive optical element is preferably arranged such that a major part of the radiation emitted by the semiconductor body passes through the refractive optical element. For example, the refractive optical element is arranged downstream of the front side of the semiconductor body in the direction of emission thereof.

As a rule, semiconductor bodies emit radiation from their front side at different exit angles. The present radiation-emitting component is based on the concept that the first part of the radiation, which is emitted at a comparatively shallow angle $\alpha$ ($\alpha$ is here relative to the front side) from the front side of the semiconductor body, firstly impinges on the reflective optical element, before passing through the refractive optical element. The angle $\alpha$ between the front side of the semiconductor body and the emitted radiation is preferably no greater than 60°.

The first part of the radiation, which impinges on the reflective optical element, is firstly directed by the reflective optical element towards an outer region of the target zone. Then the first part of the radiation passes through an outer region of the refractive optical element and is corrected thereby in the desired manner, for example is further focused into the target zone. Through previous deflection by means of the reflective optical element, the necessary action of the refractive optical element on the radiation may advantageously be reduced. It is therefore advantageously possible, in the case of the radiation-emitting component, as a rule to use low-height refractive elements and to reduce Fresnel losses.

Particularly preferably, the ratio between the maximum height of the component and the width of the semiconductor body amounts to between 1.5 and 3, limit values included.

The second part of the radiation on the other hand, which is emitted by the semiconductor body at a comparatively steep angle $\alpha$ from the front side thereof, passes directly through the refractive optical element without firstly impinging on the reflective optical element. The second part of the radiation is focused by the refractive optical element into an inner region of the target zone.

Thus, with the radiation-emitting component the radiation of the semiconductor body which is emitted at a shallow angle from the front side of the semiconductor body is guided separately from the radiation which is emitted at a steep angle from the front side of the semiconductor body. In this way, on the one hand the height of the component may advantageously be reduced and its efficiency increased.

A reflective optical element, which is suitable for directing the first part of the radiation towards the outer region of a target zone which exhibits a predetermined shape which is preferably not rotationally symmetrical, generally comprises a plurality of oblique reflective side faces, which are arranged so as to surround the semiconductor body. In this way, peripheral regions of the outer region, which preferably are not rotationally symmetrical, may advantageously be illuminated as homogeneously as possible.

Particularly preferably, the target zone takes the form of a rectangular area. Such a radiation-emitting component may for example be used as a flash for a mobile telephone.

If the target zone takes the form of a rectangular area, said rectangular area is preferably illuminated homogeneously in such a way that the relative illuminance at the corners B of the target zone exhibits between 15% and 25% of the illuminance at the center point A of the rectangle.

Furthermore, the points C of the rectangular area, which in each case lie on a connecting line between the corners B of the rectangular area and the center point A of the rectangular area, preferably exhibit a relative illuminance of between 55% and 75% of the illuminance at the center point A of the rectangular area. In this case, the ratio of the section AC to the section AB in each case amounts to between 0.65 and 0.75, limit values included.

The side faces of the optical reflective element preferably define a first aperture facing the semiconductor body and a second aperture facing away from the semiconductor body. Preferably, the first aperture defines an area which is geometrically similar to the area which is defined by the second aperture. Particularly preferably, the areas which are defined by the first and second apertures of the reflective optical element are furthermore geometrically similar to the target zone. If the area which is defined by the first and/or the second aperture of the reflective optical element is geometrically similar to the target zone, the reflective optical element is adapted to the target zone.

According to one embodiment, the first aperture defines a rectangular area. Particularly preferably, the reflective optical element here comprises four oblique side faces and a second aperture, which likewise defines a rectangular area. By means of such a reflective element, a rectangular target zone may advantageously be illuminated as homogeneously as possible.

According to one further embodiment, the first and/or the second aperture of the reflective element define an octagonal surface. The reflective element here preferably comprises eight oblique side faces. The edges of the oblique side face preferably each form the first and/or the second aperture. The eight side faces of the reflective element extending obliquely relative to the optical axis of the component are preferably arranged to form the circumferential surface of a truncated pyramid with octagonal base area. Such a reflective element is in particular also suitable for illuminating a rectangular target zone as homogeneously as possible. Using the additional four oblique side faces, it is advantageously possible to direct radiation also into the corners of the rectangular target zone.

Particularly preferably, at least one oblique side face of the reflective optical element is of curved construction. The curvature may here be for example parabolic, elliptical or hyperbolic. According to one embodiment, at least one side face of the reflective optical element takes the form of a compound parabolic concentrator (CPC), a compound elliptical concentrator (CEC) or a compound hyperbolic concentrator (CHC).

According to one further preferred embodiment, the shape of the refractive optical element is adapted to the shape of the target zone. This means for example that the base area of the refractive optical element is geometrically similar to the target zone. In particular it is possible for the refractive optical element itself or its base area not to exhibit rotational symmetry. In this way, a target zone with a predetermined shape, for example rectangular, may be illuminated as homogeneously as possible.

In particular it is possible for the refractive optical element itself or its first and/or second aperture not to exhibit rotational symmetry. In this way, a target zone with a predetermined shape, for example rectangular, may be illuminated as homogeneously as possible.

The refractive optical element may take the form, for example, of a Fresnel lens, a biconic lens, a toric lens, a lens with an outer surface in accordance with an x, y polynomial, a planar convex lens, a biconvex lens, a lens array or a segmented lens.

A biconic lens in this respect exhibits different conic constants along two mutually perpendicular axes within its base area. This makes it possible advantageously to achieve oval illumination, which is adapted to the symmetry of a rectangular target zone.

A lens whose outer surface is shaped in accordance with an x, y polynomial generally has the advantage of being particularly suitable for illuminating a rectangular target zone.

A segmented lens preferably comprises a plurality of lens segments. For example, the segmented lens comprises a central lens segment, which is surrounded by a plurality of outer segments. The central lens segment preferably directly adjoins the outer segments, i.e., an edge of the central lens segment in each case forms a common boundary line with an edge of an outer segment. Furthermore, the central lens segment preferably comprises a base area which is similar to the target zone. Furthermore, the segmented lens preferably comprises the same number of outer lens segments as the number of reflective side faces of the reflective element. The segments of the lens are preferably curved outwards, for example biconically or in accordance with an x, y polynomial.

Furthermore, the lens segments are preferably constructed and arranged such that radiation which does not impinge on the reflective side faces passes through the central lens segment, while radiation which does impinge on the side faces of the reflective element passes through the outer lens segments. Particularly preferably, an outer lens segment of the refractive element is here in each case assigned to a reflective side face of the reflective element, i.e., radiation which is reflected by a given side face is intended to pass through a given outer lens segment.

Furthermore, the refractive optical element, such as for example one of the above-stated lenses, exhibits a quadrant-symmetrical, for example elliptical shape.

A refractive optical element with a quadrant-symmetrical shape generally exhibits a rectangular base area and may in particular be used to illuminate a rectangular target zone as homogeneously as possible.

According to a further embodiment of the radiation-emitting component, the semiconductor body is embedded in a potting compound. The potting compound may for example take the form of an additional lens or of a layer.

It is possible for the potting compound to directly adjoin the refractive optical element, i.e., to form a common boundary surface with the refractive element. If the refractive optical element is mounted for example on a first major side of the reflective optical element, in this embodiment the potting compound completely fills the entire reflective optical element right up to the refractive optical element.

Alternatively, it is also possible for an air-filled space to be formed between the potting compound and the refractive optical element.

The potting compound for example contains an epoxy material, a silicone material or a mixture of a silicone material and an epoxy material. The potting compound may further also consist of an epoxy material, a silicone material or a mixture of a silicone material and an epoxy material.

According to a further embodiment, the radiation-emitting component comprises a wavelength conversion material, which converts part of the radiation generated by the semiconductor body into radiation of a different wavelength range.

The wavelength conversion material may for example be selected from the group of materials formed by the following materials: garnets doped with rare earth metals, alkaline earth sulfides doped with rare earth metals, thiogallates doped with rare earth metals, aluminates doped with rare earth metals, orthosilicates doped with rare earth metals, chlorosilicates doped with rare earth metals, alkaline earth silicon nitrides doped with rare earth metals, oxynitrides doped with rare earth metals and aluminium oxynitrides doped with rare earth metals.

Particularly preferably, the semiconductor body here emits radiation from the blue spectral range, which is partially converted into radiation of the yellow spectral range by the wavelength conversion material. Preferably, the unconverted blue radiation and the converted yellow radiation are here mixed together, such that white mixed radiation is produced. An example of a suitable wavelength conversion material for converting blue radiation into yellow radiation is YAG:Ce.

The wavelength conversion material may for example be embedded in the potting compound, the potting compound taking the form for example of an additional lens or of a layer, as already described above. If the wavelength conversion material is arranged in a layer of potting material on the semiconductor body, it is additionally possible for the semiconductor body to be embedded with the wavelength-converting layer in a potting compound which takes the form of a lens and is free of wavelength conversion material.

Moreover, the wavelength conversion material may also be present in the form of a ceramic plate, which is preferably arranged on the radiation-emitting front side of the semiconductor body. The ceramic plate is preferably arranged in direct contact with the front side of the semiconductor body, such that the ceramic plate forms a common boundary surface with the front side of the semiconductor body.

According to a further embodiment, the radiation-emitting component comprises a diffusely scattering layer, for example a diffusely scattering plate or a diffusely scattering film. The diffusely scattering layer is preferably arranged downstream of the semiconductor body in the direction of emission thereof. The diffusely scattering layer is used in particular in a component with a wavelength conversion material, in order to mask a color appearance of the wavelength conversion material for an external observer. If the wavelength conversion material is introduced for example into a potting compound in the form of a layer enveloping the semiconductor body, the diffusely scattering layer is preferably applied in direct contact onto the potting compound with the wavelength conversion material, such that the diffusely scattering layer and the potting compound form a common boundary surface. This is preferably also the case if the wavelength conversion material is present in the form of a ceramic plate.

According to a further embodiment, a reflective potting compound is arranged in the area surrounding the semiconductor body. To this end, the reflective potting compound preferably contains titanium oxide particles. The reflective potting compound is for example arranged to the side of the semiconductor body, preferably up to the active radiation-emitting zone thereof or to the radiation-emitting front side thereof, in direct contact with the side faces of the semiconductor body. The reflective potting compound advantageously reduces radiation losses via side faces of the semiconductor body and contributes to directing the radiation of the semiconductor body towards the refractive element.

The reflective potting compound for example comprises a matrix material, such as for instance silicone, into which reflective particles have been introduced, for example titanium oxide particles.

According to one embodiment, the semiconductor body is applied to a substrate. The reflective optical element is here preferably likewise fastened to the substrate, for example by adhesive bonding.

According to one embodiment, the reflective optical element comprises a recess on a major side facing away from the semiconductor body, which recess is intended to accommodate the refractive optical element. Particularly preferably, the refractive optical element is fitted flush into the recess in the reflective optical element. By means of such a recess, the refractive optical element may be simply adjusted relative to the semiconductor body.

According to a further embodiment, the radiation-emitting component comprises two or more radiation-emitting semiconductor bodies. The semiconductor bodies are here preferably arranged rotationally symmetrically relative to an optical axis of the refractive optical element. All the features which have here been described in connection with one semiconductor body, may likewise be used with two or more semiconductor bodies.

BRIEF DESCRIPTION OF THE DRAWINGS

Further advantageous embodiments and further developments of the invention are revealed by the exemplary embodiments described below in connection with the figures.

FIG. 2 and FIG. 3A show schematic sectional representations of two further exemplary embodiments of the radiation-emitting component;

FIGS. 3B and 3C show schematic perspective representations of the radiation-emitting component according to FIG. 3A;

FIGS. 6 to 11 show schematic sectional representations of further exemplary embodiments of the radiation-emitting component.

Figure 1A:
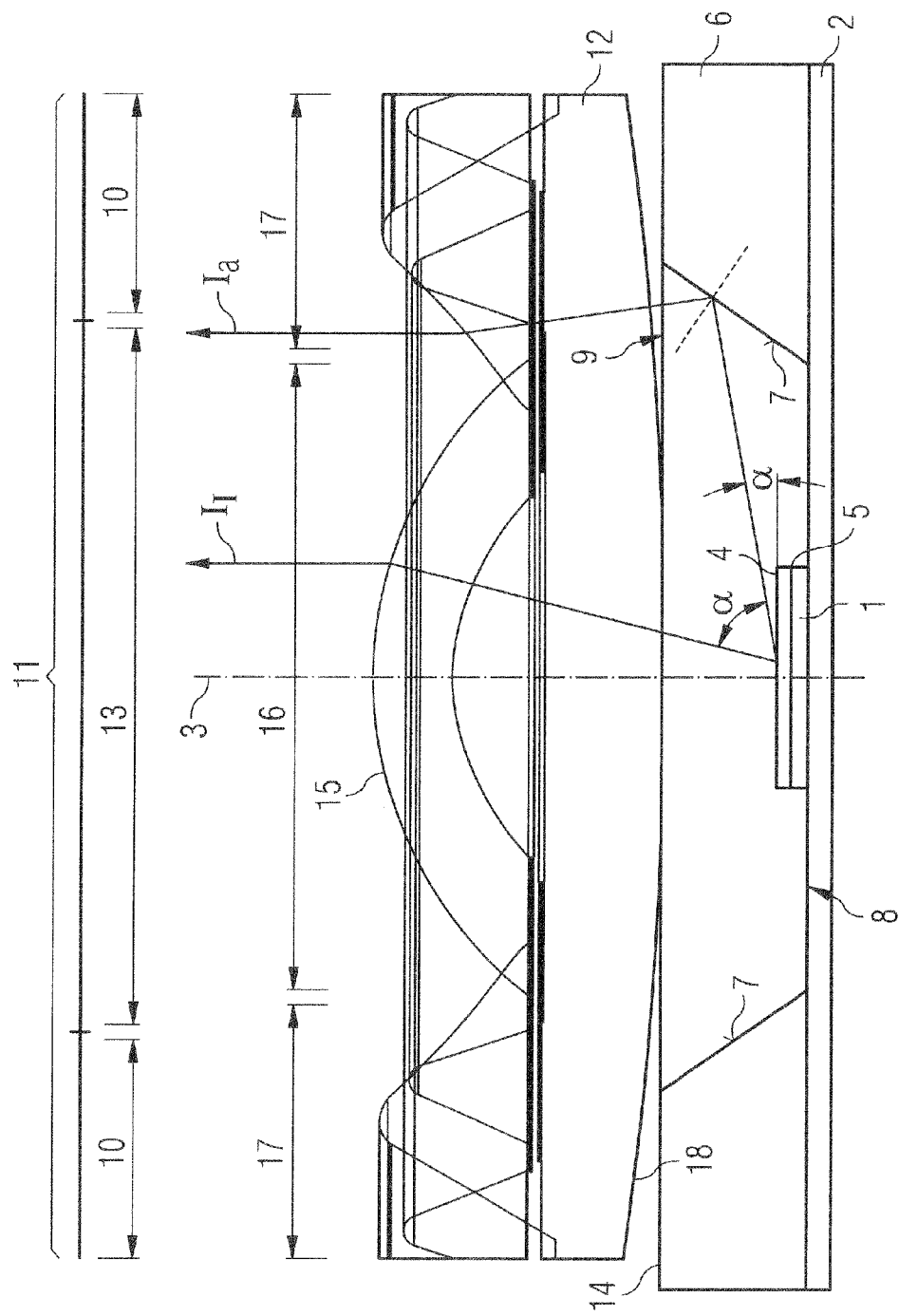
FIG. 1A shows a schematic sectional representation of a radiation-emitting component according to a first exemplary embodiment.

Identical, similar or identically acting elements are provided with the same reference numerals in the figures. The figures and the size ratios of the elements illustrated in the figures relative to one another are not to be regarded as being to scale, unless explicitly stated otherwise. Rather, individual elements, in particular layer thicknesses, may be illustrated on an exaggeratedly large scale for greater ease of depiction and/or better comprehension.

DETAILED DESCRIPTION OF ILLUSTRATIVE EMBODIMENTS

The radiation-emitting component according to the exemplary embodiment of FIG. 1A comprises a semiconductor body 1, which is fixed to a substrate 2. The semiconductor body 1 is arranged centered relative to the optical axis 3 of the component.

The semiconductor body 1 is intended for emitting electromagnetic radiation of a first wavelength range from its front side 4. To this end, the semiconductor body 1 comprises an active zone 5, which generates electromagnetic radiation when the component is in operation. The active zone 5 preferably comprises a pn-junction, a double heterostructure, a single quantum well or particularly preferably a multi quantum well structure (MQW) for generating radiation. The term quantum well structure does not here make any statement with regard to the dimensionality of the quantisation. It thus encompasses inter alia quantum troughs, quantum wires and quantum dots and any combination of these structures.

The component further comprises a reflective optical element 6, which is likewise arranged on the substrate 2.

Figure 1B:
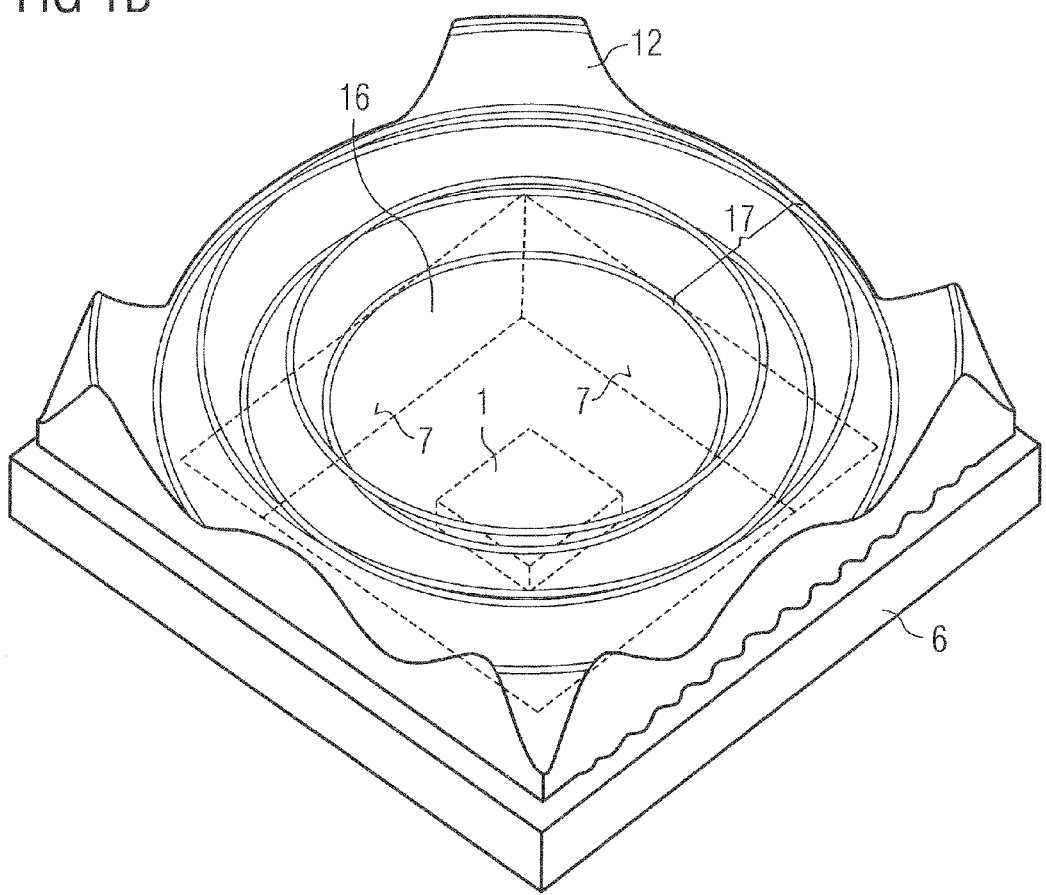
FIG. 1B shows a schematic perspective representation of the radiation-emitting component according to FIG. 1A.

As shown in FIG. 1B, the reflective optical element 6 comprises four oblique side faces 7, which are intended to reflect a first part of the radiation, which is emitted at a shallow angle α from the front side 4 of the semiconductor body 1. Furthermore, the reflective optical element 6 comprises a first aperture 8, which is defined by the side faces 7 and which is directed towards the semiconductor body 1. The first aperture 8 of the reflective optical element 6 here defines a rectangular area. The semiconductor body 1 is centered within this rectangular area.

Furthermore, the reflective element 6 comprises a second aperture 9, which is remote from the semiconductor body 1 and is likewise defined by the side faces 7. The second aperture 9 of the reflective element 6 likewise defines a rectangular area.

The oblique side faces 7 of the reflective optical element 6 are intended to direct the first part of the radiation emitted by the semiconductor body 1, which impinges directly on the reflective optical element 6, into an outer region 10 of a target zone 11. To this end, the side faces 7 are preferably of curved construction. The target zone 11 here takes the form of a rectangular area.

The radiation-emitting component additionally comprises a refractive optical element 12, which is intended to focus the first, reflected fraction of the radiation into the outer region 10 of the target zone 11 and to focus the second fraction of the radiation into an inner region 13 of the target zone 11. The refractive optical element 12 is here arranged on a first major side 14 of the reflective optical element 6, which is remote from the semiconductor body 1. The refractive optical element 12 is thus arranged downstream of the front side 4 of the semiconductor body 1 in the direction of emission thereof.

The outside 15 of the refractive optical element 12, remote from the semiconductor body 1, comprises an inner region 16 which is curved concavely outwards. The inner region 16 of the outside 15 is preferably of conical construction. In an outer region 17 of the outside 15, arranged so as to surround the inner region 16, the refractive optical element 12 comprises prismatic annular Fresnel structures. The prismatic Fresnel structures are arranged in concentric ring structures around the inner region 16 of the refractive optical element 12. The Fresnel structures are suited to focusing the first part of the radiation, which is reflected by the side walls 7, into the rectangular target zone 11. In the present exemplary embodiment the refractive optical element 12 exhibits rotational symmetry relative to the optical axis 3. In principle, however, a refractive optical element 12 with elliptical or quantum-symmetrical shape is also conceivable. The reverse 18 of the refractive optical element 12, which faces the semiconductor body 1, is curved convexly outwards. Preferably, the reverse 18 of the refractive optical element 12 is of conical construction.

As FIG. 1A shows, a beam $I_a$, which is emitted at a comparatively shallow angle α by the front side 4 of the semiconductor body 1, impinges on the oblique side face 7 of the reflective optical element 6 and is reflected thereby towards the Fresnel structures in the outer region 17 of the refractive element 12. The beam $I_a$ passes from the reflective side face 7 of the reflective element 6 through the refractive optical element 12 and is directed by the Fresnel structures of the refractive element 12 into the outer region 10 of the target zone 11.

A beam $I_i$, which is emitted at a comparatively steep angle α from the front side 4 of the semiconductor body 1, does not impinge on one of the reflective side faces 7, but rather passes directly through the refractive optical element 12. The beam $I_i$ passes through the inner region 16 of the refractive optical element 12 and is focused by the concave outside thereof into an inner region 13 of the target zone 11.

In contrast to the component of FIGS. 1A and 1B, the component according to the exemplary embodiment of FIG. 2 comprises two radiation-emitting semiconductor bodies 1. The semiconductor bodies 1 are here arranged symmetrically relative to the optical axis 3 of the component. The reflective optical element 6 further comprises a greater height than in the exemplary embodiment of FIGS. 1A and 1B, such that the reflective side faces 7 exhibit a greater surface area. Since the radiation source extends further in the component according to FIG. 2, since two semiconductor bodies 1 are used instead of one, the reflective side faces 7 need to exhibit a larger area, in order to illuminate the target zone 11 as homogeneously as possible. The use of two semiconductor bodies increases the height of the reflective element as a rule by a factor of between 1.2 and 1.7, the limit values in each case being included.

It should be noted at this point that, instead of two semiconductor bodies 1 which are preferably arranged next to one another symmetrically relative to the optical axis 3 of the component, a plurality of semiconductor bodies 1 may also be used, these preferably likewise being arranged symmetrically relative to the optical axis 3 of the component. The semiconductor bodies 1 may for example be arranged as a matrix.

Figure 3A:
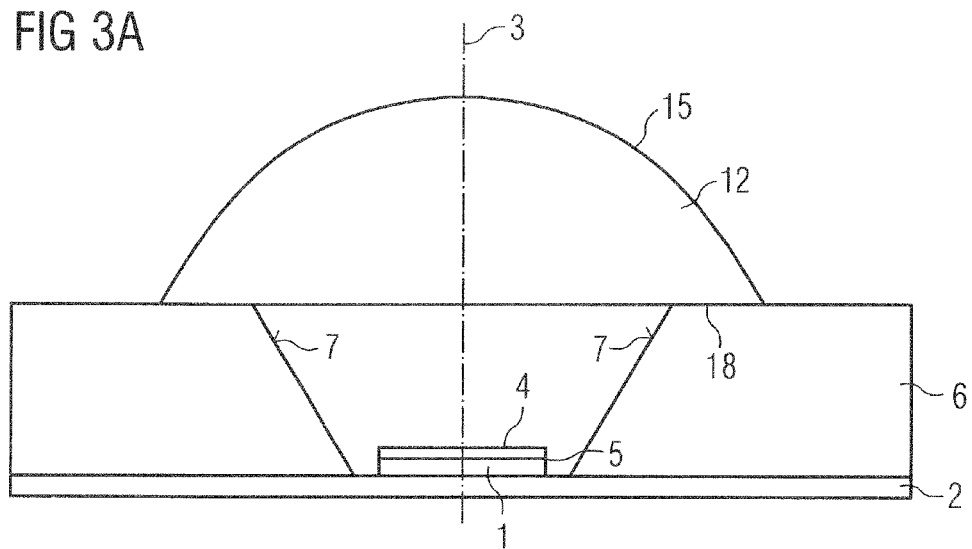

Unlike the component according to FIGS. 1A and 1B, in the component according to the exemplary embodiment shown in FIGS. 3A, 3B and 3C a toric or biconic plane convex lens is used as the refractive optical element 12. The outside 15 of the plane convex lens here exhibits an outwardly curved, convex curvature, which is preferably of conical construction. Furthermore, the lens does not exhibit rotational symmetry, instead having a virtually rectangular base area with rounded corners. The component according to FIGS. 3A, 3B and 3C is intended to illuminate a rectangular target zone 11 as uniformly as possible. The base area of the lens 12 is thus adapted to the target zone 11.

The reverse 18 of the lens 12, which is directed towards the semiconductor body 1, is of planar construction. Alternatively, this may also be curved convexly outwards, as for example in the case of the refractive optical element 12 according to FIGS. 1A, 1B and 2. An outwardly convexly curved reverse 18 of the lens generally advantageously effects greater focusing of the radiation.

Figure 4A:
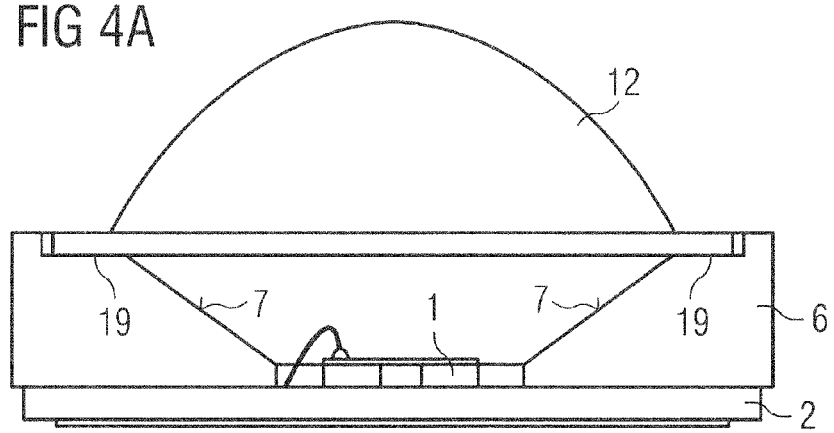
FIG. 4A shows by way of example a true-to-scale sectional representation of a component according to FIGS. 3A, 3B and 3C.
Figure 4B:
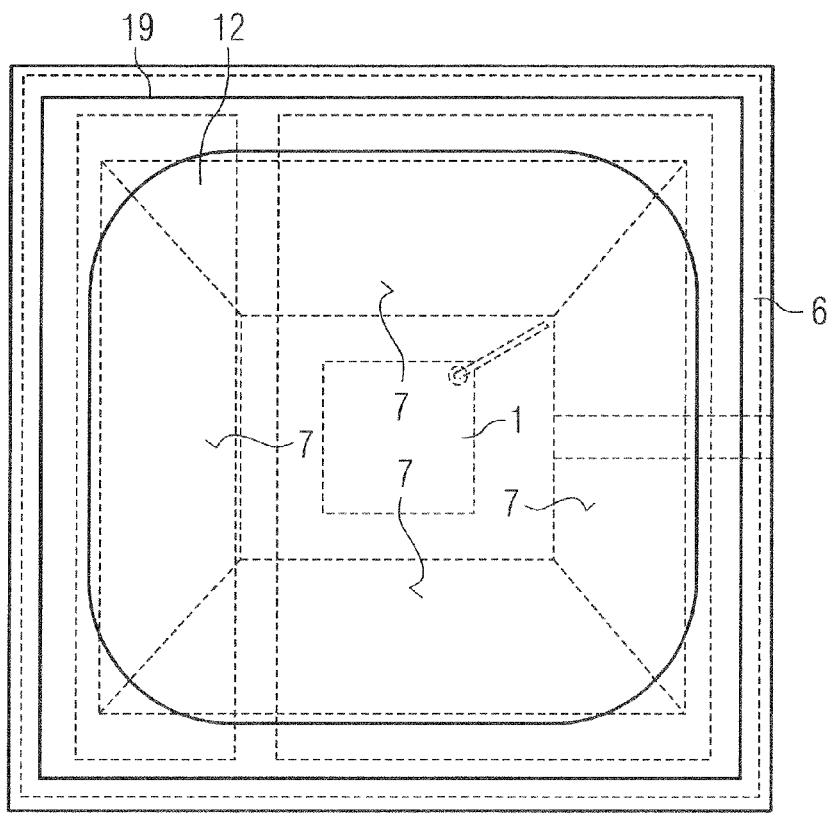
FIG. 4B shows by way of example a true-to-scale plan view of a component according to FIGS. 3A, 3B and 3C.

FIGS. 4A and 4B show possible dimensions for the component according to FIGS. 3A to 3C, by way of example. It is apparent therefrom that the total height of the component is advantageously merely around 2 mm. The sides of the component exhibit 3.8 mm and 3.7 mm. The substrate 2 here exhibits a thickness of approx. 0.15 mm.

Furthermore, as shown in FIG. 4A, the refractive optical element 12 is fitted flush into a recess 19 of the reflective optical element 6.

Figure 5A:
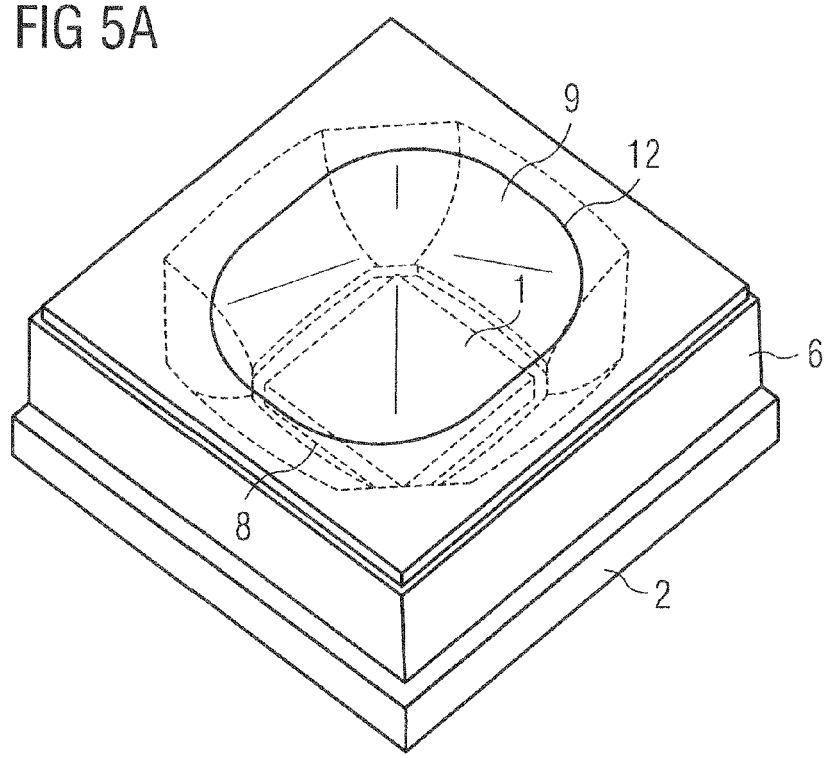
FIGS. 5A and 5B show schematic perspective representations of a radiation-emitting component according to a further exemplary embodiment.
Figure 5B:
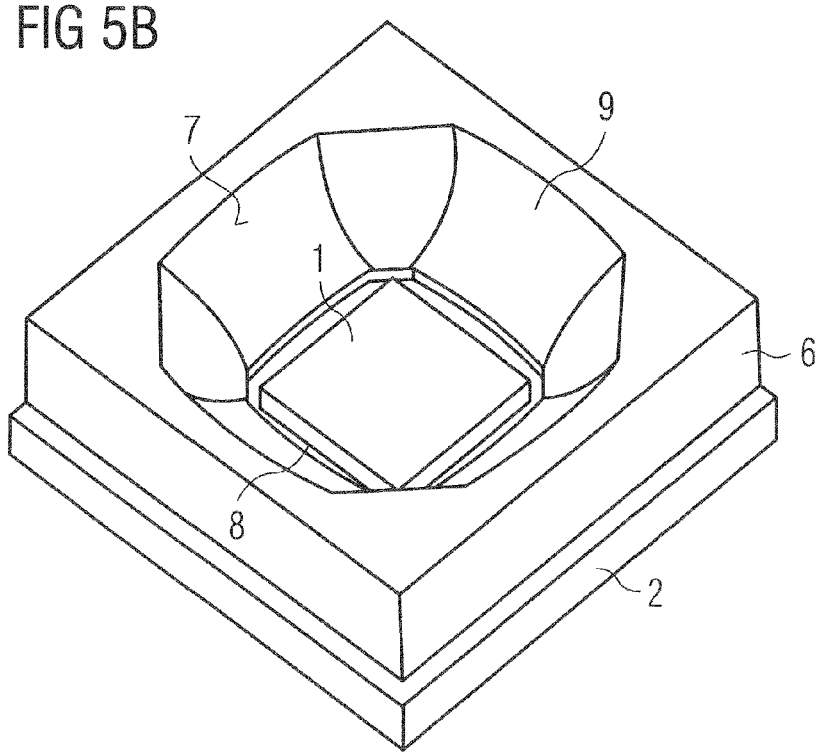

Unlike in the previous exemplary embodiments, the component according to the exemplary embodiment of FIGS. 5A and 5B comprises a reflective optical element 6 with a first aperture 8 and a second aperture 9, which each define an octagonal area. It is moreover also possible for the first aperture 8 to define a rectangular area and for the second aperture 9 to define an octagonal area.

In accordance with the octagonal area, which is defined by the second aperture 9, the reflective optical element 6 comprises eight side faces 7. The side faces 7 extend obliquely relative to the first aperture 8 and to the second aperture 9 and are preferably of curved construction. The side faces 7 are intended to direct radiation of the semiconductor body 1, which is emitted at a shallow angle α from the front side 4 thereof, into an outer region 10 of a rectangular target zone 11. In FIG. 5B, the refractive element 12 is additionally omitted for reasons of clarity.

In the case of the component according to FIG. 5A, a plane convex lens may for example be used as the refractive optical element 12, as has already been described with reference to FIGS. 3A, 3B and 3C.

Figure 6:
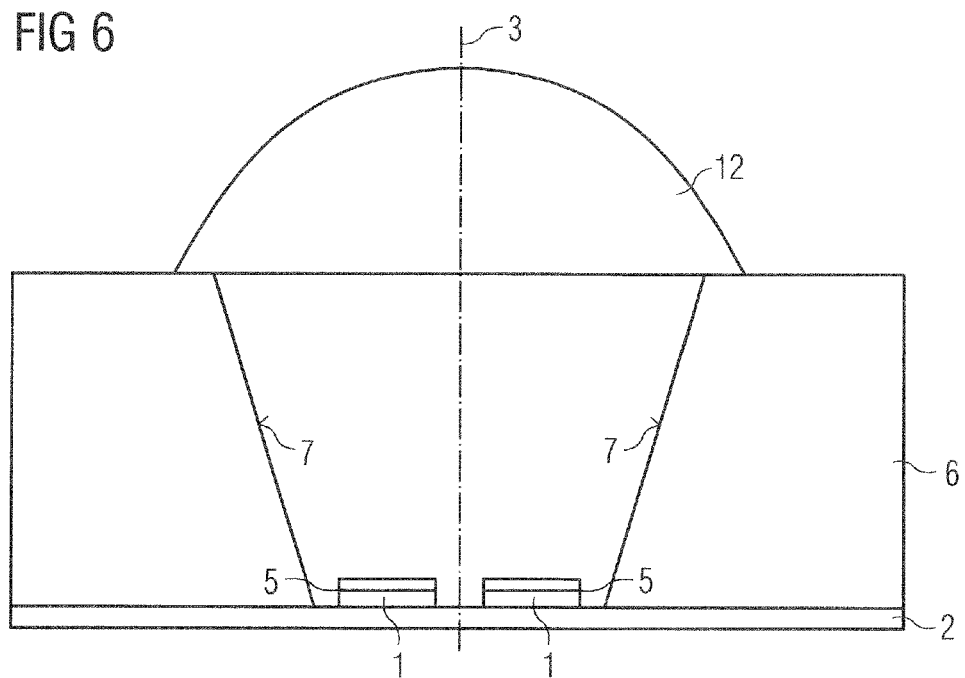

Unlike the exemplary embodiment of FIG. 3A, the component according to the exemplary embodiment of FIG. 6 comprises two semiconductor bodies 1, which are arranged next to one another symmetrically relative to the optical axis 3 of the component. The reflective optical element 6 here exhibits a greater height than in the case of the component according to FIG. 3A, so as to compensate for the larger radiation exit area resulting from the two semiconductor bodies 1. In the case of the component according to FIG. 6, a plane convex lens may likewise be used as the refractive optical element 12, as has already been described with reference to FIGS. 3A, 3B and 3C.

Figure 7:
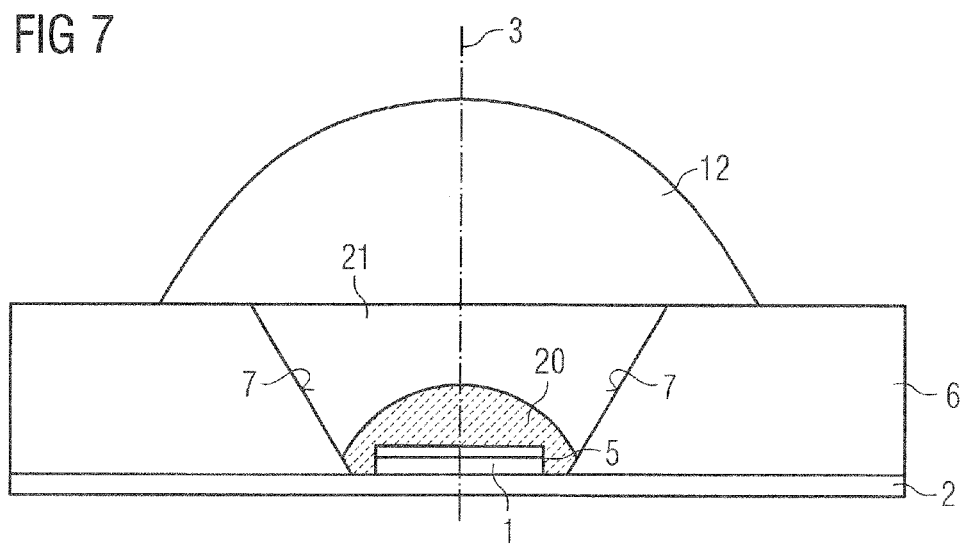

Unlike in the exemplary embodiment of FIG. 3A, the component according to the exemplary embodiment of FIG. 7 comprises a potting compound 20, which embeds the semiconductor body 1 and forms a lens. In the present case, the potting compound 20 does not completely fill the inside of the reflective optical element 6. This means that a beam emitted from the front side 4 of the semiconductor body 1 firstly passes through the potting compound 20 and then into the air-filled space 21 between potting compound 20 and refractive optical element 12, so as then to enter the refractive optical element 12. The beam is finally coupled out from the outside 15 of the refractive optical element 12.

The potting compound 20 comprises one of the following materials, for example, or consists of one of the following materials: a silicone, an epoxy or a mixture of silicone and epoxy.

Unlike in FIG. 3A, the component according to FIG. 8 comprises a wavelength conversion material 22, which is suitable for converting some of the radiation of the semiconductor body 1 into radiation of another wavelength range. The semiconductor body 1 preferably emits radiation from the blue spectral range, which is converted by the wavelength conversion material 22 into radiation from the yellow spectral range, such that white mixed light is produced. A component which emits white mixed light is suitable for example for use as a flash for a camera in a mobile telephone.

The wavelength conversion material 22 is introduced into a matrix material, for example a silicone, an epoxy or a mixture of silicone and epoxy. The matrix material with the wavelength conversion material 22 envelops the semiconductor body 1 and forms a planar surface over the front side of the semiconductor body 1. An air-filled space 21 is present between the matrix material with the wavelength conversion material 22 and the refractive element 12. A plane convex lens may for example be used as the refractive element 12, as has already been described for example with reference to FIGS. 3A, 3B and 3C.

As an alternative to the planar, wavelength-converting potting compound of the semiconductor body 1, as shown in FIG. 8, it is also possible for a wavelength-converting layer to be applied just to the front side 4 of the semiconductor body 1. Such a wavelength-converting layer may for example be formed by a ceramic plate or a matrix material, into which particles of a wavelength conversion material 22 have been introduced. A semiconductor body 1 with a wavelength-converting layer on its front side 4 may furthermore be enveloped for example by a clear potting compound 20, which is free of wavelength conversion material 22. Such a clear potting compound 20 may fill the reflective optical element 6 either completely or only partially. Furthermore, the potting compound 20 may take the form of a lens or exhibit a planar surface.

Unlike with the component according to FIG. 3A, in the case of the component according to the exemplary embodiment of FIG. 9 the semiconductor body 1 is provided with a clear potting compound 20, which exhibits a planar surface. A diffusely scattering layer 23 is applied to the potting compound 20, which is suitable for creating the appearance of a white colour for an external observer. A diffusely scattering layer 23 is in particular also used in conjunction with a wavelength conversion material 22, to mask a color appearance of the wavelength conversion material 22.

Figure 10:
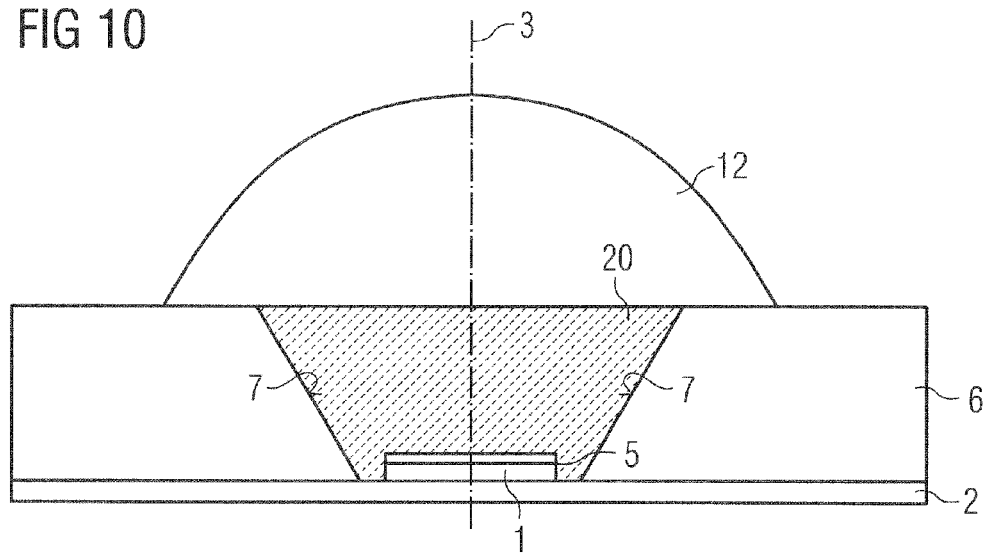

Unlike with the component according to FIG. 3A, in the case of the component according to the exemplary embodiment of FIG. 10, the semiconductor body is embedded in a clear potting compound 20, the potting compound 20 filling the reflective optical element 6 completely. The potting compound 20 thus forms a common boundary surface with the refractive optical element 12 and there is no air-filled space between the potting compound 20 and the refractive optical element 12.

Figure 11:
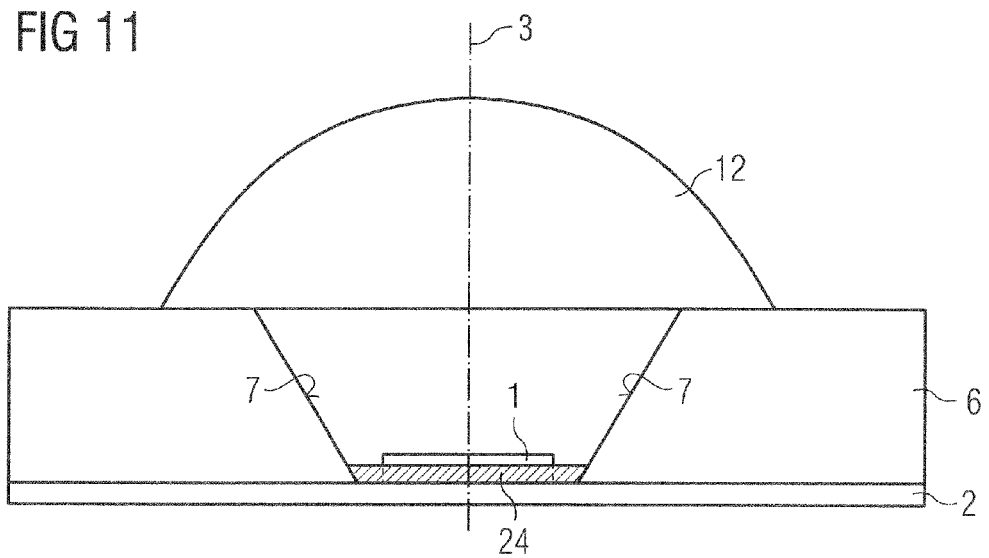

Unlike with the component according to FIG. 3A, in the case of the component according to the exemplary embodiment of FIG. 11 the semiconductor body 1 is surrounded by a highly reflective potting compound 24. This preferably does not extend any higher than up to the active zone 5 of the semiconductor body 1.

Figure 12A:
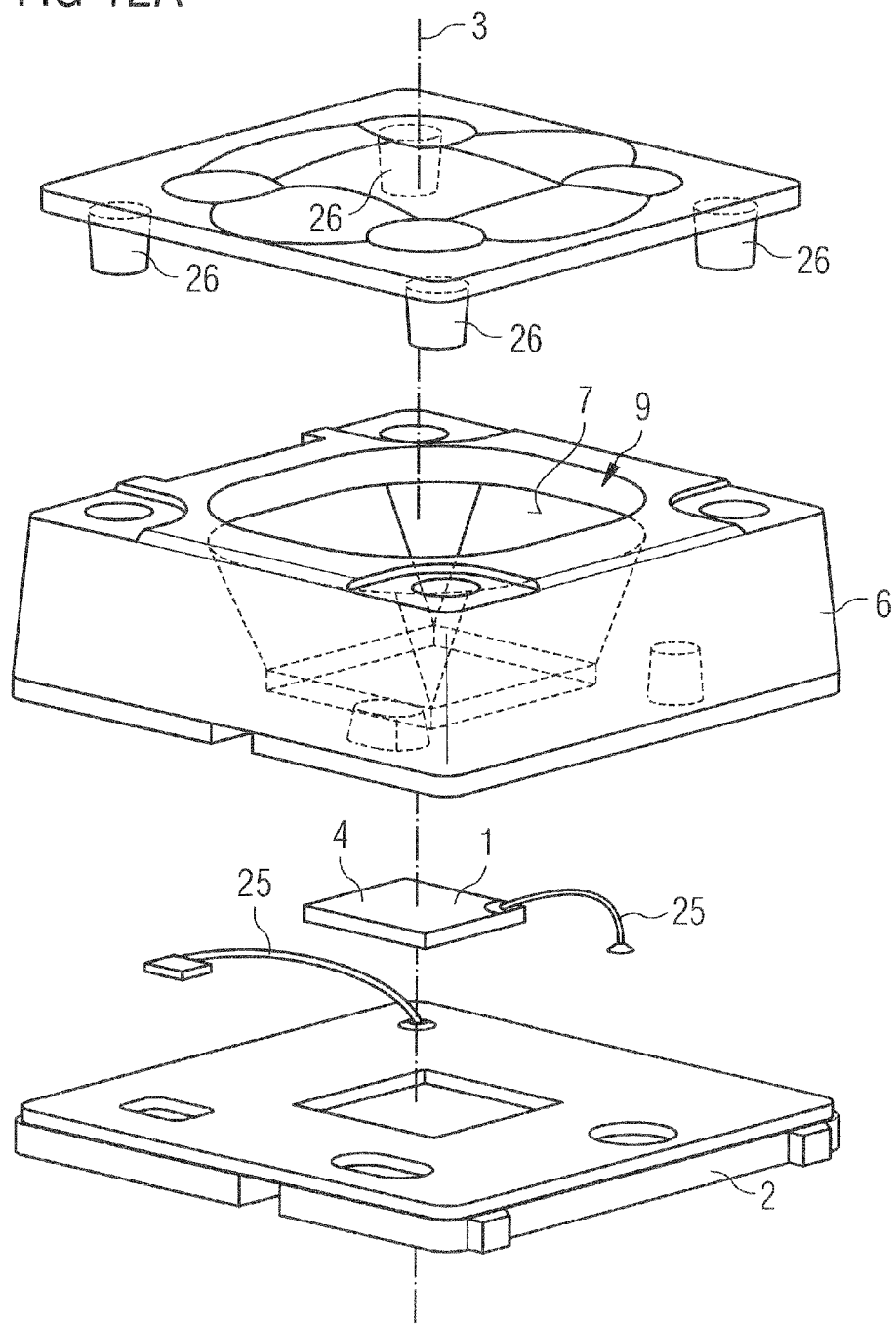
FIGS. 12A and 12B show schematic representations of a radiation-emitting component according to a further exemplary embodiment.
Figure 12B:
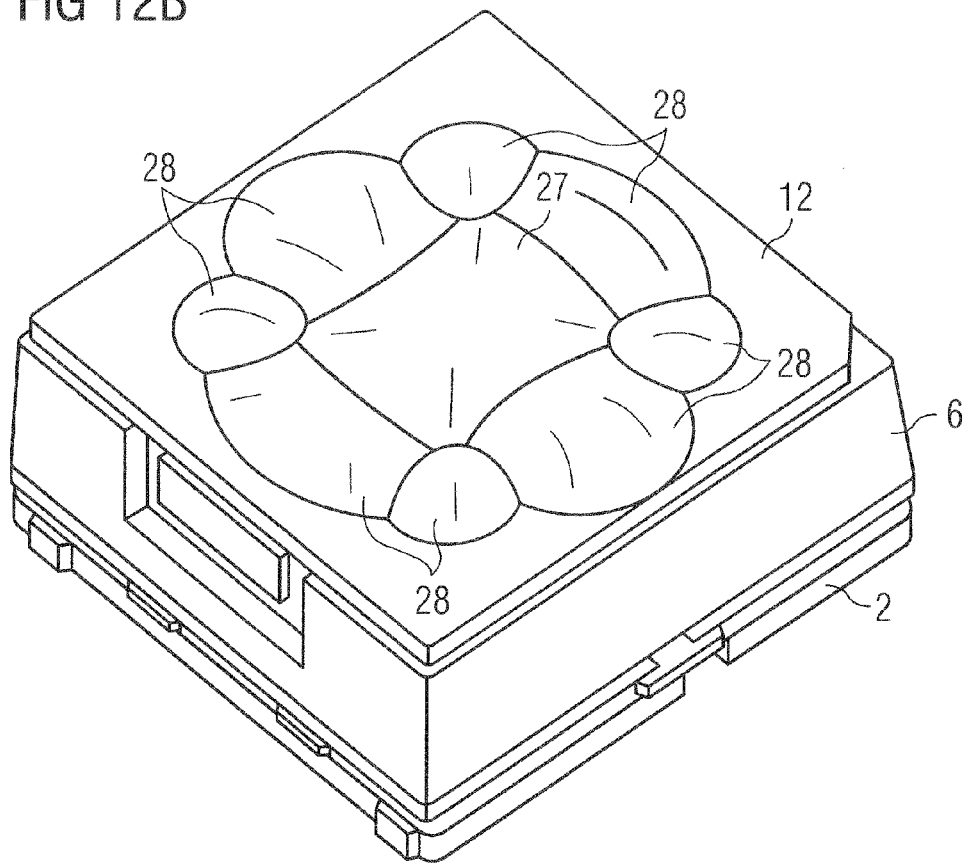

The radiation-emitting semiconductor component according to the exemplary embodiment of FIGS. 12A and 12B comprises a substrate 2 with a rectangular base area. A semiconductor body 1 is arranged on the substrate 2, centered relative to the optical axis 3 and contacted electrically with two bonding wires 25.

A reflective optical element 6 likewise comprising a rectangular base area is furthermore arranged on the substrate 2. Like the reflective optical element 6 according to the exemplary embodiment of FIGS. 5A and 5B, the reflective optical element 6 comprises a first aperture 8 and a second aperture 9, which each define an octagonal area. In accordance with the octagonal area defined by the second aperture 9, the reflective optical element 6 comprises eight oblique side faces 7, which are intended to direct radiation emitted at a shallow angle α from the front side 4 of the semiconductor body 1 into an outer region 10 of a rectangular target zone 11.

In the present case, a refractive optical element 12 is arranged on the reflective optical element 6. In each of the corners of its rectangular base area the refractive optical element 12 comprises a pin 26, which is intended to be fitted into a corresponding recess in the refractive optical element 12.

The refractive optical element 12 in this case takes the form of a segmented lens, as is apparent in particular in FIG. 12B. In the present case, the segmented lens comprises a centrally arranged central first segment 27, which is curved outwards. The curvature of this central segment 27 may be biconic or configured according to an (x, y)-polynomial. The central segment 27 of the refractive optical element is surrounded peripherally by further, outer segments 28, which are likewise curved biconically outwards. An edge of the central segment 27 here forms a common boundary line in each case with an edge of an outer segment 28. In accordance with the octagonal area defined by the second aperture 9, the central segment 27 is surrounded by eight outer lens segments 28. The outer lens segments 28 are each arranged point-symmetrically relative to a center point of the central segment 27, through which the optical axis 3 of the component extends. With the assistance of the segmented lens, it is in particular possible to illuminate a rectangular target zone very homogeneously.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. A radiation-emitting component comprising:
   a semiconductor body configured to emit electromagnetic radiation from its front side;
   a reflective optical element with a plurality of oblique, reflective side faces, which are arranged so as to surround the semiconductor body; and
   a refractive optical element arranged downstream of the reflective optical element in a direction of emission of the semiconductor body,
   wherein a first part of the radiation of the semiconductor body, which is emitted from the front side of the semiconductor body under a flat angle relative to the front side being an angle smaller than or equal to 60°, impinges directly on the reflective element and is directed to an outer region of a target region by the reflective element, and thereby passes through an outer region of the refractive optical element, and wherein a second part of the radiation of the semiconductor body, which is emitted from the front side of the semiconductor body under a comparatively steep angle relative to the front side of greater than 60°, impinges directly on the refractive optical element without first impinging on the reflective optical element, passes through an inner region of the refractive optical element and thereby is bundled in an inner region of the target region by the refractive optical element.

2. The radiation-emitting component according to claim 1, wherein at least one oblique side face of the reflective optical element is curved.

3. The radiation-emitting component according to claim 1, wherein a shape of the refractive optical element or of the reflective optical element is adapted to a shape of a target zone.

4. The radiation-emitting component according claim 3, wherein the target zone takes the form of a rectangular area.

5. The radiation-emitting component according to claim 1, wherein the refractive optical element comprises a Fresnel lens, a biconic lens, a toric lens, a lens with an outer surface in accordance with an x, y polynomial, a planar convex lens, a biconvex lens, a lens array or a segmented lens.

6. The radiation-emitting component according to claim 1, wherein the refractive optical element exhibits a quadrant-symmetrical shape.

7. The radiation-emitting component according to claim 1, wherein an aperture of the reflective element, which is defined by the side faces of the reflective element, defines a rectangular area.

8. The radiation-emitting component according to claim 1, wherein an aperture of the reflective element, which is defined by the oblique side faces of the reflective element, defines an octagonal area.

9. The radiation-emitting component according to claim 1, further comprising a wavelength conversion material configured to convert some of the radiation generated by the semiconductor body into radiation of a different wavelength range.

10. The radiation-emitting component according to claim 1, further comprising a second radiation-emitting semiconductor body.

11. The radiation-emitting component according to claim 1, wherein a ratio between a maximum height of the component and a width of the semiconductor body is between 1.5 and 3, limit values included.

12. The radiation-emitting component according to claim 1, wherein a first or second aperture of the reflective element limits an octagonal area, the first and/or second aperture being limited by the oblique side faces of the reflective element.

13. A radiation-emitting component comprising:
a semiconductor body configured to emit electromagnetic radiation from its front side;
a reflective optical element with a plurality of oblique, reflective side faces, which are arranged so as to surround the semiconductor body; and
a refractive optical element arranged downstream of the reflective optical element in a direction of emission of the semiconductor body,
wherein a first part of the radiation of the semiconductor body, which is emitted from the front side of the semiconductor body under a flat angle relative to the front side being an angle smaller than or equal to 60°, impinges directly on the reflective element and is directed to an outer region of a target region by the reflective element, and thereby passes through an outer region of the refractive optical element,
wherein a second part of the radiation of the semiconductor body, which is emitted from the front side of the semiconductor body under a comparatively steep angle relative to the front side of greater than 60°, impinges directly on the refractive optical element without firstly impinging on the reflective optical element, passes through an inner region of the refractive optical element and thereby is bundled in an inner region of the target region by the refractive optical element, and
wherein a first or second aperture of the reflective element limit an octagonal area, the first or second aperture being limited by the oblique side faces of the reflective element.

* * * * *